(12) United States Patent
Emsley et al.

(10) Patent No.: US 6,184,683 B1
(45) Date of Patent: Feb. 6, 2001

(54) METHOD TO IMPROVE RESOLUTION OF TWO-DIMENSIONAL HETERONUCLEAR CORRELATION SPECTRA IN SOLID-STATE NMR

(75) Inventors: Lyndon Emsley, St. Martin le Vinoux; Dimitrios Sakellariou, Lyons; Anne Lesage, Villeurbanne, all of (FR); Stefan Steuernagel, Karlsruhe (DE)

(73) Assignee: Bruker Analytik GmbH, Rheinstetten (DE)

( * ) Notice: Under 35 U.S.C. 154(b), the term of this patent shall be extended for 0 days.

(21) Appl. No.: 09/349,085

(22) Filed: Jul. 8, 1999

(30) Foreign Application Priority Data

Jul. 29, 1998 (DE) ................................ 198 34 145

(51) Int. Cl.⁷ .................................................. G01V 3/00
(52) U.S. Cl. ........................................... 324/309; 324/307
(58) Field of Search .................... 324/309, 307, 324/314, 300

(56) References Cited

U.S. PATENT DOCUMENTS 5,926,023 * 7/1999 Johannes et al. .................... 324/309

FOREIGN PATENT DOCUMENTS

| 196 48 391 C1 | 4/1998 | (DE) . |
| 0 481 256 A1 | 4/1992 | (EP) . |
| 2 319 848 | 6/1998 | (GB) . |

OTHER PUBLICATIONS

Gross et al., Journal of Chemical Physics, vol. 108, No. 17., 7286–7293 (1998).
Ramamoorthy et al., Journal of Magnetic Resonance, Series B 107, 88–90 (1995).
A.Bielecki et al., Chem.Phys.Lett.155 (1989), p. 341–346.
B.–J. van Rossum et al., Journal of Magnetic Resonance, A120 (1996), p. 274–277.
H. Köstler and Rainer Kimmich, Journal of Magnetic Resonance B 102 (1993), p. 177–182.

* cited by examiner

Primary Examiner—Christine K. Oda
Assistant Examiner—Brij B. Shrivastav

(57) ABSTRACT

A new two-dimensional NMR carbon-proton chemical shift correlation experiment, the MAS-J-HMQC experiment, is proposed for rotating solids. The magnetization transfer used to obtain the correlations is based on scalar heteronuclear J couplings. The 2D map provides through-bond chemical shift correlations between directly bonded proton carbon pairs in a similar way to corresponding high-resolution liquid state experiments. The transfer through J coupling is shown to be efficient and more selective that those based on heteronuclear dipolar couplings. The experiment, which works at high MAS spinning rates, yields the unambiguous assignment of the proton resonances. The experiment is demonstrated on several organic compounds.

20 Claims, 7 Drawing Sheets

Fig. 1a
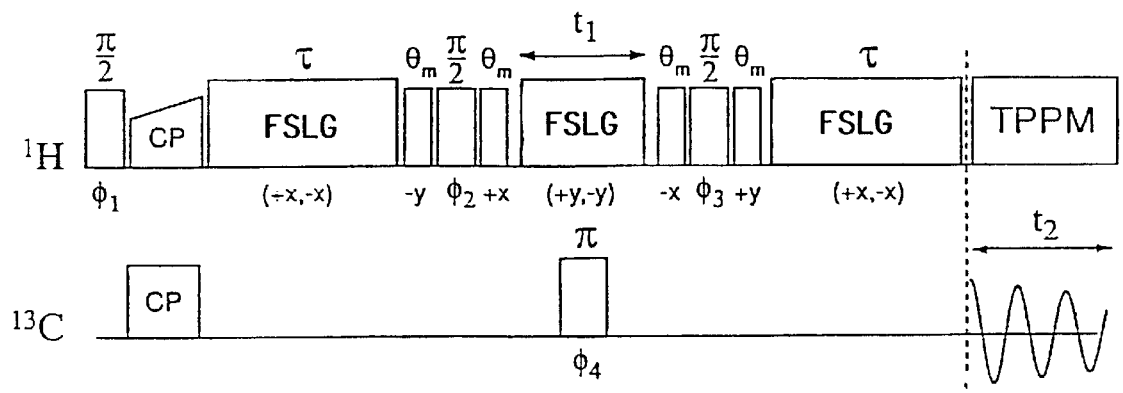
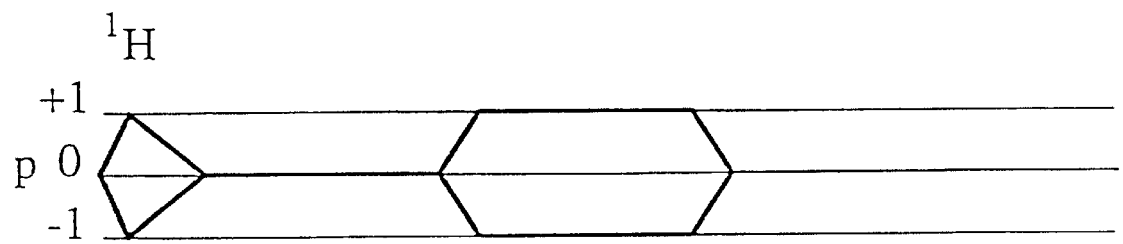
Fig. 1b
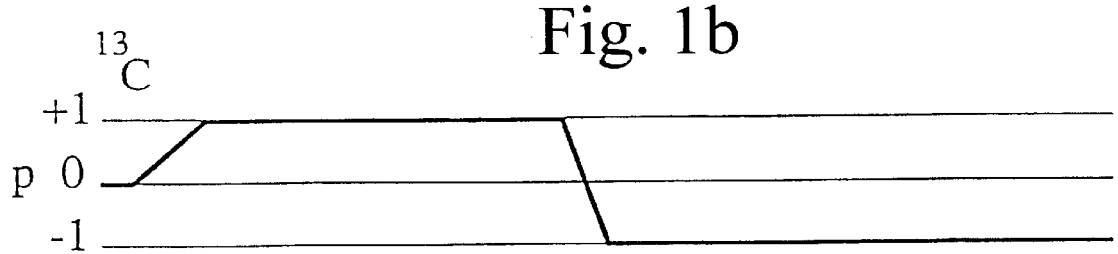
Fig. 1c

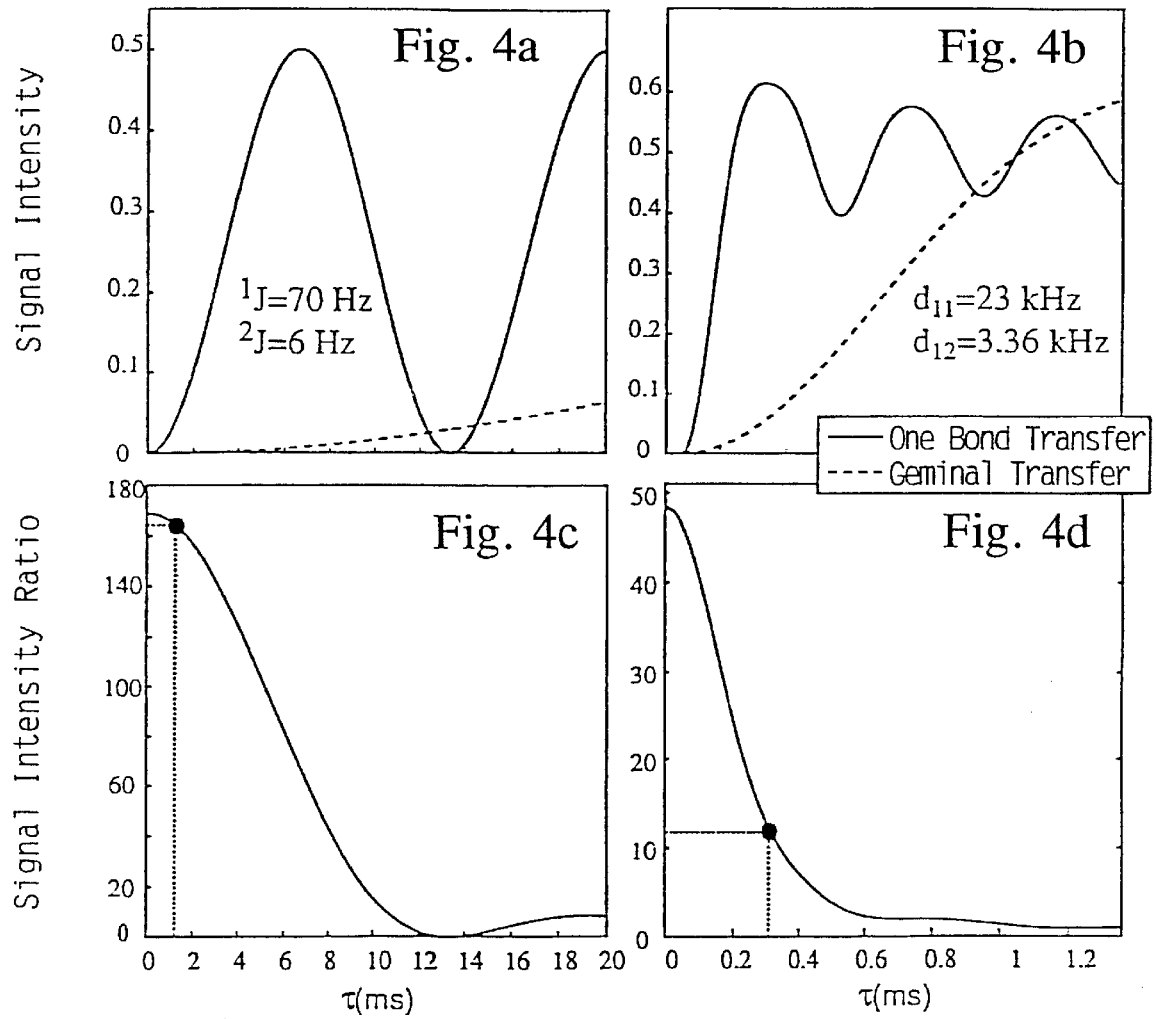

METHOD TO IMPROVE RESOLUTION OF TWO-DIMENSIONAL HETERONUCLEAR CORRELATION SPECTRA IN SOLID-STATE NMR

This application claims Paris Convention priority of German patent application number 198 34 145.8 filed Jul. 29, 1998, the complete disclosure of which is hereby incorporated by reference.

BACKGROUND OF THE INVENTION

The invention concerns a method of two-dimensional, heteronuclear correlation spectroscopy for the investigation of solid state samples, containing a first ($^1$H) and a second ($^{13}$C) nuclear species, in a nuclear magnetic resonance (NMR) spectrometer by means of an NMR pulse sequence, which pulse sequence comprises a preparation interval, an evolution interval, a mixing interval and a detection interval, wherein during the preparation interval the first nuclear species is excited by at least one preparation RF pulse in a first frequency band and is exposed to evolution RF pulses inside the first frequency band during the evolution interval and wherein during the detection interval the first nuclear species is exposed to at least one decoupling RF pulse inside the first frequency band while the free induction decay in the second frequency band is detected and wherein the pulse sequence ($1 \leq p \leq n$) is repeated n times in a row with identical preparation interval, mixing interval and detection interval but with changed evolution interval and wherein the sample rotates with a rotation frequency greater than 1 kHz about an axis which is tilted by about 54° with respect to the axis of a homogeneous magnetic field and wherein the at least one preparation RF pulse is broad-banded with a center frequency in the center of the NMR spectrum of the first nuclear species of the sample effecting a rotation of the nuclear magnetization of the first nuclear species about an axis perpendicular to the direction of the magnetic field (X) with an angle of preferably 90° and wherein the evolution RF pulses form a so-called FSLG sequence with two successive broadband evolution RF pulses, phase shifted with respect to each other by 180° (Y, −Y), whose center frequencies are shifted in opposite directions with respect to the preparation RF pulse and which each effect a rotation of the nuclear magnetization of the first nuclear species by about 294°.

Such a method is known from EP-A 0 481 256 (U.S. Pat. No. 5,117,186).

Nuclear resonance (NMR) is a phenomenon occurring in relation to a selected group of atomic nuclei and that is based on the existence of magnetic nuclear moments of these atomic nuclei. If an atomic nucleus with nuclear spin is placed in a strong homogeneous and static magnetic field (so-called "Zeeman field") and is excited by means of a weak radio frequency (RF) magnetic field, the nuclear spin precesses with a natural resonance frequency, the Larmor frequency, which is characteristic for each nuclear species with nuclear spin and which depends on the magnetic field strength effective at the location of the nucleus. Typical atomic nuclei with magnetic moments are e.g. protons $^1$H, $^{13}$C, $^{19}$F and $^{31}$P. The resonance frequencies of the nuclei can be observed by observing the transverse magnetization occurring after a strong RF pulse. Usually, the measured signal is transformed into a frequency spectrum by Fourier transformation.

Although identical nuclei show the same frequency dependence on the magnetic field, differences of the immediate chemical surroundings of each nucleus can modify the magnetic field, so that nuclei of the same sample do not see the same effective magnetic field. The differences of the local magnetic fields effect spectral shifts of the Larmor frequency between two such chemically not equivalent nuclei which are called "chemical shifts". These chemical shifts are of interest since they yield information about the number and position of the atoms inside a molecule and about the relative arrangement of neighboring molecules inside a compound.

Unfortunately, it is not always possible to give an interpretation of the frequency spectra caused by chemical shift since there are additional and possibly dominant interactions present.

This is particularly the case in NMR spectroscopy of solids. In NMR spectroscopy of liquids, the fast molecular movements have the tendency to isolate the nuclei and to separate the nuclear interactions, so that it is much easier to recognize different nuclei in a spectrum. In solid state NMR there are many interactions between the molecules masking the result. E.g., magnetic moments of neighboring nuclei interfere with each other leading to interactions called "dipole-dipole couplings". These couplings broaden the characteristic resonance lines and mask the "fine" resonance structure caused by chemical shift. A further problem occurring in relation to solids and which is not present in liquids, is that the orientation of molecules in solids are relatively fixed with respect to the applied Zeeman field. Therefore the chemical shifts are anisotropic so that a contribution to the resonance frequency depends on the spatial orientation of the molecules with respect to the magnetic field. Therefore, it is important to suppress some of these interactions in order to obtain meaningful results for the others. Usually this is achieved by exciting the system at selected frequencies with the consequence that undesired interactions cancel or at least that they are averaged to a reduced amplitude. For example, in solids the above-mentioned anisotropy of the chemical shift is usually largely reduced by orienting the solid sample relative to the applied magnetic field at the so-called "magic angle" (54° 44') and by rotating it at this angle with a comparatively fast frequency. This averages the anisotropic field components to zero.

In a similar fashion, it is possible to reduce with known techniques spin-spin interactions by irradiating the nuclei with RF pulses at or close to the Larmor frequencies. By carefully selecting various polarizations and phases of the RF pulses, the magnetization of interfering nuclear spin systems in neighboring groups can be changed. Thereby spin-spin interactions can effectively be averaged out so that their contribution to the final measuring result is strongly reduced. Since for each nuclear species the Larmor frequency is different, an applied RF field will have a much greater effect on those spins with a Larmor frequency close to the applied frequency than on those spins with a significantly different Larmor frequency. In this way, applied RF fields can be used to influence one nuclear species whereas others remain unaffected.

Because of the special problems of solid state NMR, one usually applies a two-dimensional spectroscopy technique in the time domain in order to improve resolution. With this technique it becomes possible to investigate the interaction or "correlation" between two different nuclear species inside a solid—the interaction between protons and $^{13}$C nuclei is usually of great interest in many organic solids. The basic technique of two-dimensional heteronuclear correlation in relation to solids is well-known and described in many articles, as e.g. in "Heteronuclear Correlation Spectroscopy" by P.

Caravatti, G. Bodenhausen and R. R. Ernst, Chemical Physics Letters Vol. 89, No. 5, pp. 363–367 (July 1982) and in "Heteronuclear Correlation Spectroscopy in Rotating Solids" by P. Caravatti, L. Braunschweiler and R. R. Ernst, Chemical Physics Letters Vol. 100, No. 4, pp. 305–3107 (September 1983). We explicitly refer to the contents of these articles.

As described in the above-mentioned articles, the two-dimensional heteronuclear correlation technique comprises an "experiment" in the time domain generally consisting of four different sequential time intervals. The first interval is called "preparation interval". During this time, one of the two nuclear species under investigation is transferred into an excited, coherent nonequilibrium state, which changes or "evolves" during the following time intervals. The preparation interval can consist of irradiating of a single RF pulse or alternatively of a sequence of RF pulses. Usually, the preparation interval has a fixed length of time.

A second time interval is called "evolution interval" during which the excited nuclear spins "evolve" under the influence of the applied magnetic field, of the neighbor spins, possibly of irradiated periodic RF pulse sequences and of the sample rotation. Evolution of the excited nuclei during this interval makes it possible to determine these frequencies. A series of "experiments" or "scans" is executed, whereby the evolution time of the evolution interval is incremented systematically.

The evolution interval is followed by a "mixing interval". During the mixing interval, one or more RF pulses may be irradiated effecting the coherence or polarization transfer from the excited nucleus to the other investigated nuclear species. The coherence or polarization transfer, triggered by the mixing process, is characteristic of the investigated nuclear system.

Finally, the mixing interval is followed by a "detection interval" where the resonance frequencies of the second nuclear species are measured. Generally, during this time further pulses or continuous RF energy is irradiated in order to suppress a further interaction between both nuclear species (decoupling).

After Fourier transformation, the result of the multiple experiment is a two-dimensional spectral profile, called heteronuclear correlation spectrum (also: 2D HETCOR). One axis of the plot depicts the detected frequencies of the second nuclear species. The other axis represents the frequencies of the first nuclear species, derived via the repeated scans with incremented evolution times. Since the measured frequencies of the second nuclear species depend on the energy transfer from the originally excited first nuclear species and since on the other hand the state of the first nuclear species depends on the evolution time, the second plot axis effectively represents the chemical shifts due to the different first nuclear species in a specific molecule and on their spatial arrangement with respect to the second nuclear species. The measured peaks of the plots correspond to correlations between selected nuclei of first and second nuclear species within a given molecule. An advantage of the heteronuclear correlation is that it spreads the proton resonances over the by far greater chemical shift range of $^{13}C$. For this reason, this technique can yield well resolved information about the proton chemical shift of a sample, although it is impossible to resolve these chemical proton shifts with other one-dimensional spectroscopy techniques.

Generally, in a typical two-dimensional heteronuclear correlation experiment, applied to an organic material, the correlation between hydrogen nuclei (protons) $^1H$ and $^{13}C$ nuclei are investigated inside the sample. In order to do this, an RF pulse is applied during the preparation interval, exciting the hydrogen protons. In theory, the proton spins would now perform a free precession motion during the evolution interval. During the mixing interval, the protons interact with the $^{13}C$ nuclei via direct heteronuclear dipole-dipole coupling. Finally, during the detection interval the $^{13}C$ frequencies are measured. One of the advantages of such an experiment is that the heteronuclear coupling between the protons and the $^{13}C$ nuclei depends exclusively from the distance between the nuclei, independent of the chemical shift. Therefore, the correlation offers a possibility to investigate the stereochemistry of individual molecules as well as the relative arrangement of neighboring molecules.

The problem of this technique is that other couplings, as e.g. a "homonuclear" dipole-dipole coupling between protons and the "heteronuclear" dipole-dipole coupling between protons and carbon nuclei can mask the desired result if these interactions are allowed to be present during the evolution interval, since they have an influence on the measurement of chemical shifts in the proton spectrum. These last two interactions effect a peak broadening of the proton chemical shifts, leading to an overlap of different proton sites and, as a consequence, to a smearing out of the assignment to the individual sites. Therefore it is necessary to suppress these two very strong interactions during the evolution interval. For certain conditions, if an element more abundant than $^{13}C$ is investigated, e.g. phosphorus or aluminum, it may be necessary to suppress the homonuclear interaction between these nuclei.

Generally, one has to apply carefully selected RF pulse sequences in order to ensure suppression of the homonuclear and heteronuclear interactions during the evolution interval, wherein the pulses are either irradiated to the protons, to the $^{13}C$ nuclei or to both simultaneously. The object of these pulse sequences is to suppress the results of the unwanted interactions or to average them out. Many pulse sequences of this type are known in the corresponding prior art. For example, there are prior art pulse sequences suppressing relatively effectively the homonuclear interactions between protons. In addition, other pulse sequences are known to suppress heteronuclear interactions between protons and $^{13}C$ nuclei. Experiments to simultaneously suppress both, homonuclear and heteronuclear interactions, simply combined the known RF pulse sequences. However, since the known pulse sequences were not designed in view of a combination, very long sequences of RF pulses resulted that were necessary to suppress both interaction types and the methods did not yield satisfying results. Therefore, the number of resolved, non-equivalent proton sites was considerably limited. This on its turn limited the number of compounds that could be successfully investigated.

The publication EP-A 0 481 256 cited at the beginning, describes an improved method suppressing heteronuclear interactions more effectively. The suggested pulse sequence is designed such that it can be used in combination with one of the previously known pulse sequences. In this way, homonuclear as well as heteronuclear interactions are suppressed. In addition, the suggested pulse sequence effectively suppresses homonuclear interactions. Therefore it can be used in relation to a multitude of nuclear species. In detail, during the preparation interval the first nuclear species is excited by a preparation pulse and is irradiated during the evolution interval for homonuclear decoupling between nuclei of the first species (generally protons) with a so-called BLEW-12 sequence (phases X Y –X –X –Y –X X Y X X –Y –X), whereas for decoupling between both nuclear species (generally $^{13}$H–$^{13}$C) and of the nuclei of the second species (generally $^{13}$C—$^{13}$C) the second nuclear species is irradiated with a pulse sequence of 12 90° RF pulses with a predetermined phase sequence, the so-called BB-12 sequence (–X Y –X X Y –X –X Y X –X Y –X). Since in this way the homo- as well as the heteronuclear interactions are decoupled, the protons can freely evolve being only under the influence of their chemical shift, leading to an improved resolution. After the evolution interval, two separated pulses (θ and φ pulses) are irradiated onto the protons in order to—in view of the following detection—tilt the magnetization formed during the evolution interval into a plane perpendicular to the magnetic field. The θ-pulse is a 90° pulse and the φ pulse has an angle of 63° (with –Y phase). These two pulses are followed by the so-called WIM-24 ("Windowless Isotropic Mixing") sequence selectively transferring nuclear polarization from the protons to directly coupled carbon nuclei via direct heteronuclear dipole interaction. In addition, the WIM-24 sequence suppresses the proton and $^{13}$C chemical shifts as well as the proton-proton and $^{13}$C—$^{13}$C homonuclear couplings. However, it leaves unaffected the proton-$^3$C heteronuclear coupling. The WIM-24 sequence consists of a 24 pulse sequence irradiated onto the protons and a corresponding 24 pulse sequence simultaneously irradiated onto the $^{13}$C nuclei. The sequence is prior art and is described in detail in the article "Heteronuclear Correlation Spectroscopy in Rotating Solids" by P. Caravatti, L. Braunschweiler and R. R. Ernst in Chem. Phys. Letters 100, No. 4, pp 305–310 (1983).

Finally, during the detection interval, a continuous wave (CW) signal of relatively high intensity is irradiated at the proton frequency in order to decouple in a known way the protons from the $^{13}$C nuclei and the $^{13}$C FID is measured.

During the entire experiment, the solid state sample is routinely rotated about the "magic angle" in order to reduce broadenings caused by the anisotropy of the chemical shift.

In the EP-A 0 481 256 (U.S. Pat. No. 5,117,186) mentioned at the beginning, it is also pointed out that instead of the WIM-24 sequence other prior art pulse sequences can be used, too, in order to effect selective cross polarization during the mixing interval and still to simultaneously suppress the homonuclear dipole interaction. The WIM-24 sequence is mentioned to be preferred but a phase and frequency switched Lee-Goldburg sequence (FSLG) in combination with a phase switched $^{13}$C sequence might effect a similarly effective selective cross polarization during the mixing interval. This mixing method is described in detail in the article "Frequency-Switched Pulse Sequences: Homonuclear Decoupling and Dilute Spin NMR in Solids" by A. Bielecki, A. C. Kolbert and M. H. Levitt in Chem. Phys. Letters 155, Nos. 4,5, pp. 341 (1989).

However, the method known from EP-A 0 481 256 (U.S. Pat. No. 5,117,186) has the disadvantage that the BLWE-12 sequence applied during the evolution interval has to be relatively long. Generally, it is limited to more than 36 μs because of the otherwise endangered safety of the probehead against high voltage breakdown. This on the other hand limits the possible spin rates of the sample rotation about the magic angle since the rotation time has to be large compared to the time period of the BLEW-12 sequence. In practice, spin rates are limited to below 5 kHz by this, whereas present conventional probeheads already allow spin rates around 15 kHz. The article J. Magn. Res. A 120, p. 274–277 (1996) describes a method where even without additional narrowing of the proton spectrum indications of a resolution of the chemical shift can be achieved by a pulse sequence at high fields.

The article J. Magn. Res. A 121, p. 114–120 (1996) describes a method of NMR imaging where the line narrowing effect of the FSLG sequence is used to effect slice selection.

In the German patent DE 196 48 391 C1 (GB 2 319 848 A), in a dipolar HETCOR experiment the nuclear spins are decoupled during the evolution interval with respect to dipole coupling by an FSLG RF pulse sequence irradiated in the proton frequency band. Since this sequence—compared to the ones used so far—can be very short and there is no need to simultaneously irradiate radio frequency in the range of the S nuclei, this method is particularly suited to high rotational speeds of the sample and high magnetic fields where it effects a decisive resolution improvement.

All carbon-proton correlation experiments reported so far, are based on a magnetization transfer by dipolar couplings. Various schemes of polarization transfers have been suggested and were investigated in view of their sensitivity and distance selectivity, e.g. experiments from Hartmann-Hahn cross polarization to WIM (windowless isotropic mixing) multipulse sequences. Since all these experiments make use of interactions through space, one of the main problems remains to ensure the sufficient selectivity of the magnetization transfer in order to usefully interpret the spectrum. In other words, only magnetization from protons to directly bonded carbons shall be transferred but not to carbon nuclei that are further removed. Whereas correlation signals between not-bonded pairs may yield valuable information about molecule conformation, they nevertheless severely complicate analysis of a two-dimensional spectrum.

There is therefore a need for a method mentioned at the beginning enabling an improved selective magnetization transfer.

SUMMARY OF THE INVENTION

This purpose is achieved in that during the preparation interval the first nuclear species is irradiated with CP radio frequency pulses in the first frequency band in order to transfer the nuclear magnetization to the second nuclear species, and that the second nuclear species is irradiated in a second frequency band with at least one excitation radio frequency pulse, that the mixing interval is split into two partial intervals, the first of which is located between preparation and evolution interval, and the second one between evolution interval and detection interval, and that in both mixing partial intervals the mixing radio frequency pulses form a so-called FSLG sequence with two successive broadband evolution radio frequency pulses, phase shifted (X, –X) with respect to one another by 180° with center frequencies that are shifted with respect to that of the preparation radio frequency pulse in opposite directions and which each effect a rotation of the nuclear magnetization of the first nuclear species by about 294°, and that in the center of the evolution interval the second nuclear species experiences a broadband 180° refocusing pulse with a center frequency in the center of the nuclear resonance spectrum of the second nuclear species, whereby a correlation spectrum of both nuclear species is created that correlates the chemical shifts of both nuclear species for directly bonded pairs via scalar coupling.

In this way, a two-dimensional proton-carbon correlation technique is presented, based on polarization transfer via heteronuclear J coupling and which will be named MAS-J-HMQC in the following. Analogously to the known HMQC experiment of solvent NMR, the sequence makes use of heteronuclear multiple quantum coherences in order to effect a correlation between isotropic chemical shifts of directly bonded pairs.

It has become evident that this technique is sensitive, and that scalar couplings represent a much more selective correlation method than dipolar couplings. The experiment may be executed with high rotational frequencies. Provided that the carbon spectrum is assigned, the experiment yields a unique identification of the proton chemical shifts in solids.

The use of the—otherwise and in a different context known—phase and frequency shifted Lee-Goldburg sequence (FSLG) in the evolution interval shortens the respective cycle time decisively. A typical value is about 10 $\mu s$ for the basis FSLG sequence, whereby even shorter time seem well to be feasible. In this way, the maximum spin rate of present probeheads can be fully made use of. 15 kHz pose no problem any more whatsoever.

As a consequence, the method may be applied without problems in higher field strength magnets, without the appearance of interfering sidebands.

In this way, also a higher spectral dispersion is achieved, increasing resolution in particular in the F1 dimension (first nuclear species).

Higher spin rates already decouple quite efficiently first and second nuclear species (generally named I and S spins, mostly, but not exclusively, protons and $^{13}C$) as well from each other as within one species, so that only reduced demands have to be met by the efficiency of the decoupling sequence within the evolution interval (in this case FSLG). As a consequence, the experiment becomes less sensitive to misalignments.

With the method mentioned at the beginning, it was necessary to apply simultaneously a BLEW-12 and a BB-12 sequence in the evolution interval in order to decouple both nuclear species. In the method according to the invention, this is not necessary any more, since it is already achieved by the high spin rate.

Since simultaneous decoupling is not necessary any more, there is the further advantage that, with less danger for the probehead, higher decoupling fields can be irradiated, since now only one RF field is present and since voltage breakdowns become more likely if several RF voltages are applied simultaneously because of the adding up of voltages.

It has also been shown experimentally that the efficiency of the FSLG sequence used in the evolution interval in decoupling the spins of the first nuclear species ("abundant" spins, mostly protons or $^{19}F$) is superior to each other sequence (BLEW-12 or BR-24), so that the chemical shift resolution of these spins is considerably better. In practice, a resolution results that cannot be achieved even in a well-aligned BR-24 experiment to investigate "abundant" spins (for this object, BR-24 was up to now considered the best sequence).

A modification of the method to perform so-called "spectral editing" (selective measurement of rare spins with different "degree of protonation" similar to the DEPT sequence in solutions) becomes possible in this way.

The method may easily be integrated in a 3D method.

Preferably, during the evolution interval only the 180° refocusing pulse is irradiated in the frequency band of the second nuclear species. It may be adjusted with respect to amplitude and duration in a way not critical to the experiment such that voltage breakdowns in the probehead are safely avoided.

Preferably the first nuclear species is $^1H$ and the second nuclear species $^{13}C$. For many materials, in particular in the organic field, these are the most interesting "abundant" and "rare" nuclei.

In a preferred embodiment, both evolution RF pulses are irradiated (p-1) times in a row to execute the pulse sequence n times, preferably 512 times, in the $p^{th}$ evolution interval (1<p≦n). This results in a successive incrementation.

Preferably, between the first mixing partial interval and the evolution interval, three RF pulses are irradiated in the frequency band of the first nuclear species, the first one rotating the nuclear magnetization of the first nuclear species by about 54° ($\Theta_m$) about an axis perpendicular to the magnetic field (−Y), followed by a respectively phase shifted ($\phi_2$) 90° pulse, followed by an RF pulse, rotating the nuclear magnetization of the first nuclear species by about 54° ($\Theta_m$) about an axis perpendicular to the magnetic field (+X), and between the evolution interval and the second mixing partial interval three RF pulses are irradiated in the frequency band of the first nuclear species, the first one rotating the nuclear magnetization of the first nuclear species by about 54° ($\Theta_m$) about an axis perpendicular to the magnetic field (−X), followed by a respectively phase shifted ($\phi_3$) 90° pulse, followed by an RF pulse, rotating the nuclear magnetization of the first nuclear species by about 54° ($\Theta_m$) about an axis perpendicular to the magnetic field (+Y). This is a particularly advantageous mixing method, but not the only possible one.

A particularly preferred method makes use of a TPPM sequence (Two Pulse Phase Modulated) during the detection interval, decoupling the nuclear spins of the first nuclear species. This decoupling is described in the article by A. E. Bennett, C. M. Rienstra, M. Auger, K. V. Lakshmi and R. G. Griffin in J. Chem. Phys. 103 (1995) 6951 ff, as well as in the article J. Magn. Res. A 120, p. 274–277 (1996).

It is further preferred to insert a delay interval between the pth detection interval and the $(p+1)^{th}$ preparation interval that is longer than the relaxation times $T_1$ of both nuclear species. Thereby, prior to the subsequent sequence, otherwise interfering residual magnetizations have largely decayed.

In order to further eliminate phase errors, it is advantageous to vary the phases of the excitation RF pulses in the intervals according to a CYCLOPS sequence. The CYCLOPS sequence is for example described in the textbook "A Handbook of Nuclear Magnetic Resonance" by Ray Freeman, Longman Scientific & Technical (1990), p. 151–156.

The method according to the invention is particularly advantageous for rotation frequencies of the sample about the magic angle that are greater than 10 kHz.

The above-mentioned advantages of the method according to the invention are particularly apparent if the time periods of both evolution RF pulses are both shorter than 15 $\mu s$.

It is further preferred that the frequency shift of the center frequencies of both evolution RF pulses with respect to the preparation pulse are symmetric and between ±40 kHz and ±100 kHz. This yielded the best experimental results, in particular if the frequency shift of the center frequencies of both evolution RF pulses is phase-continuous.

Since the sequences are not complicated, since they are not sensitive against misalignments and due to the improved resolution, it is straightforward to apply the method as part of a three-dimensional spectroscopy method.

The method may advantageously be applied for editing of nuclear resonance spectra (spectral editing). Spectral editing is described in detail in the textbook "A Handbook of Nuclear Magnetic Resonance" by Ray Freeman, Longman Scientific & Technical (1990), p. 137–141 as well as in the article by D. Burum and A. Bielecki, J. Magn. Res. 95, p.184 ff. (1991).

Further details of the invention are disclosed by the following figures and may be derived from them. Obviously, these figures may be applied on their own or in combination without leaving the frame of the invention.

It is shown in:

BRIEF DESCRIPTION OF THE DRAWING

FIG. 1a on a horizontal time axis the successive time intervals (sometimes called also "periods") of a sequence of a preferred embodiment of the inventive method;

FIG. 1b calculated curves of the evolution of the observable magnetization according to the carbon multiplicity as a function of the delay time τ in the "ideal" case of liquids;

FIG. 1c calculated curves of the evolution of the observable magnetization according to the carbon multiplicity as a function of the delay time τ in solid samples with a linewidth of some Hertz (15 to 50 Hz);

FIG. 4 Comparison of the effectivities of the bonding and geminal transfer in the MAS-J-HMQC Experiment (a) and in the dipolar CP-HETCOR experiment (b), (c) and (d) show the ratio of the mechanisms of both experiments;

DESCRIPTION OF THE PREFERRED EMBODIMENTS

Figure 2:
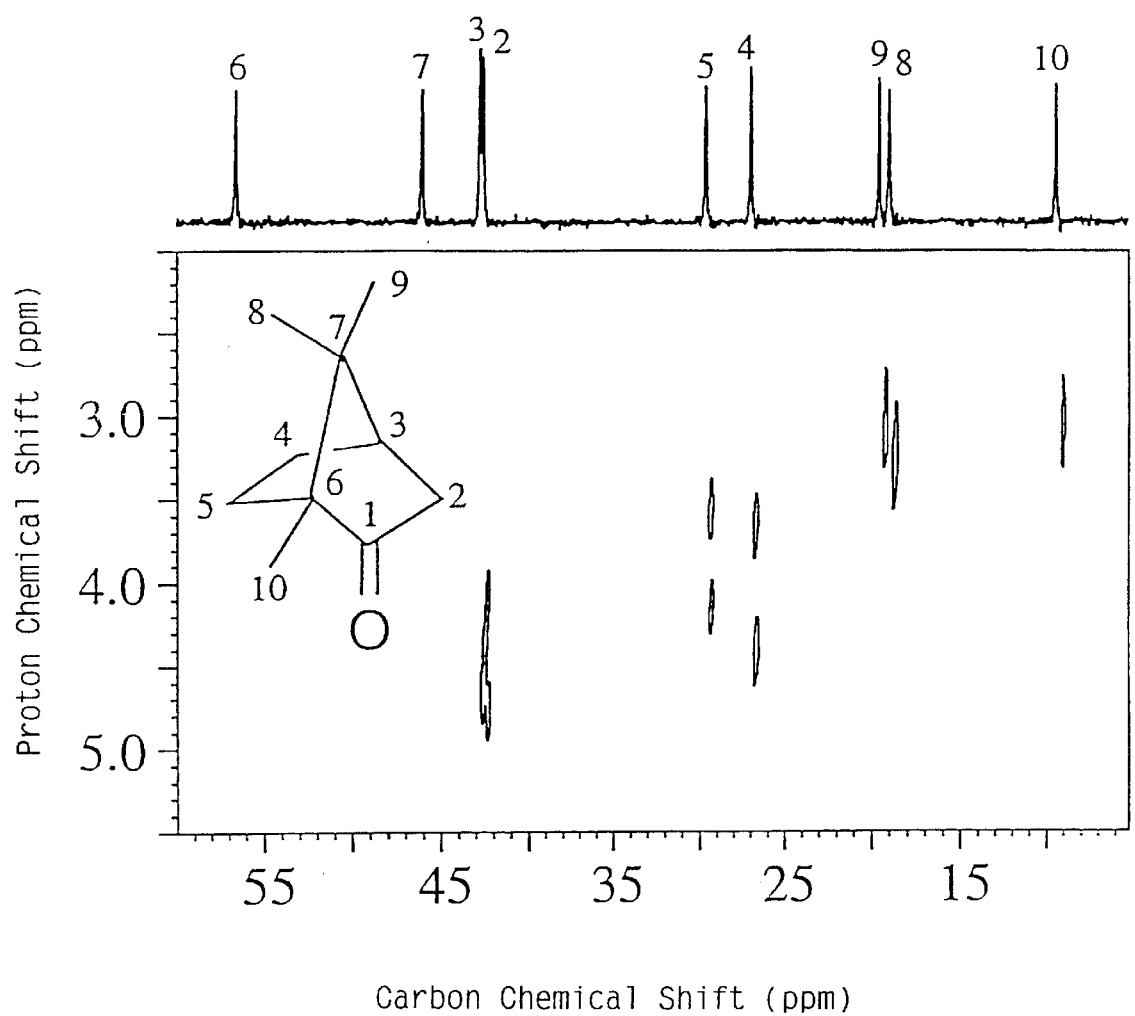
FIG. 2 MAS-J-HMQC spectrum of camphor.

FIG. 1a shows with a horizontal time axis the successive time intervals (also called "periods") of a sequence of a preferred embodiment of the inventive method. The shown sequence is repeated n (in the example 256) times during the method, whereby the preparation interval, the mixing intervals and the detection interval each remain unchanged, the content of the evolution interval is, however, incremented, i.e. during the first sequence, the interval is absent, then it has the content shown in FIG. 1a and during the subsequent sequences the content is again added each time, so that in the $256^{th}$ sequence both evolution pulses are irradiated 255 times immediately after each other.

The preferred pulse sequence for the MAS-J-HMQC experiment is depicted in FIG. 1a. After cross polarization from protons (I spins) to carbon (S spins) the carbon magnetization evolves during delay time τ under the isotropic Hamilton operator of scaled heteronuclear $J_{CH}$ coupling. Indeed, during this time the proton-proton dipole couplings are eliminated by a frequency switched Lee-Goldburg decoupling (FSLG), whereas the remaining inhomogeneous interactions, i.e. the chemical shift and the heteronuclear couplings, are averaged, by rapid magic angle spinning, to their isotropic components, leaving the isotropic chemical shift and the scalar coupling. For a pair of covalently bonded $^1H$—$^{13}C$ spins, the carbon magnetization leads to an in-phase ($S_x$) and to an antiphase ($2I_zS_y$) coherence with respect to the attached proton. A 90° pulse applied on protons transforms the antiphase carbon coherence into a double-quantum heteronuclear coherence ($I_xS_y$), which will evolve during $t_1$ under the only effect of the proton chemical shift. Indeed, the heteronuclear multiple-quantum (MQ) coherence is insensitive to heteronuclear couplings and the proton-proton dipolar couplings are removed by the FSLG decoupling. Carbon chemical shift evolution during the periods τ and during $t_1$ is refocused by the 180° pulse applied in the middle of the pulse sequence. At the end of the $t_1$ evolution period, the MQ coherence is converted back into an antiphase carbon coherence by the second 90° proton pulse, and after the second τ period, into an in-phase observable coherence. The first and the third 54.7° "magic" pulse applied on protons, respectively at the end of the first evolution period τ and at the end of the $t_1$ period, compensate for the tilted precession under FSLG around the effective field (aligned with the magic angle) and rotate the proton magnetization into the z axis of the laboratory frame. In the same way, the second "magic" pulse applied before the $t_1$ evolution period brings the proton magnetization perpendicular to the effective field, whereas the fourth "magic" pulse rotates it from the z axis to the effective field. During the acquisition period, TPPM heteronuclear decoupling is applied. Due to the FSLG sequence, the heteronuclear couplings and the proton chemical shift in $\omega_1$ are scaled by a factor $1/\sqrt{3}$. For a $CH_2$ or $CH_3$ group, higher order coherences are created at the end of the τ evolution period, i.e. triple or quadruple heteronuclear MQ coherences. However, the phase cycle of the pulse sequence, indicated in the legend of FIG. 1a, selects the double quantum heteronuclear coherences. Note that the MAS-J-HMQC experiment is quite analogous to the well-known HMQC liquid-state NMR experiment.

According to the carbon multiplicity, the intensity of the observable magnetization will evolve differently as a function of the delay τ. The calculated evolution curves are shown in FIG. 1b and c.

In the "ideal liquid-state" case (FIG. 1b), the maximum excitation of heteronuclear DQ coherence occurs for $\tau=1/(J_{CH})$ for a CH or $CH_3$ groups, and for $\tau=1/(2J_{CH})$ for a $CH_2$ group. In solid samples, where a line broadening of several tens of Hertz has to be considered, the signal intensity will be strongly attenuated by transverse relaxation (FIG. 1c). However, if the FSLG sequence applied during the 2τ period is efficient enough to yield line widths comparable to the size of the scaled heteronuclear scalar coupling (Δ=30 Hz), then a significant signal should be observed (under FSLG decoupling, a $J_{CH}$ coupling of 125 Hz, which is a typical value for a $sp^3$ carbon in hydrocarbons, will give an effective scaled coupling of 72 Hz), and the optimal delay which will allows the excitation of DQ heteronuclear coherences for all the CH groups, lies around to 2 ms.

The (natural abundance) samples of camphor, tyrosine and cholesteryl acetate were purchased from Sigma and used without further recrystallisation. The tripeptide Boc-Ala-Ala-Pro-O-Bzl (where Boc stands for terbutoxycarbonyl and Bzl for Benzyl) was synthesized in the laboratory and crystallized from diisopropyloxide. Approximately 20 mg of each sample was used. The experiments were performed on a Bruker DSX 500 spectrometer (proton frequency 500 MHz) using a 4 mm triple resonance MAS probe. The sample volume was restricted to about 25 μl in the center of the rotor to increase the radio-frequency field homogeneity. The proton RF field strength was set to 100 kHz during both the τ delays (FSLG decoupling) and during acquisition (TPPM decoupling). The offsets for FSLG decoupling were carefully adjusted on camphor and on a natural abundance sample of L-alanine, for which the fine multiplet structure due to scalar $J_{CH}$ couplings can be resolved. For the cross-polarization step, the radio-frequency field was set to 80 kHz for carbon, while a ramped RF field was applied on protons, and matched to obtain optimal signal. A 32 step phase cycle was used. Synchronization of the τ delay with the rotor period was used. Quadrature detection in $\phi_1$ was achieved using the States-TPPI method.

FIG. 2 shows the MAS-J-HMQC spectrum recorded on camphor. The assignment of the 1D spectrum had been previously reported (Benn R., Grondey H., Brevard C., Pagelot A., *J. Chem. Soc. Chem. Commun.* 1988, 102–103).

Figure 3A:
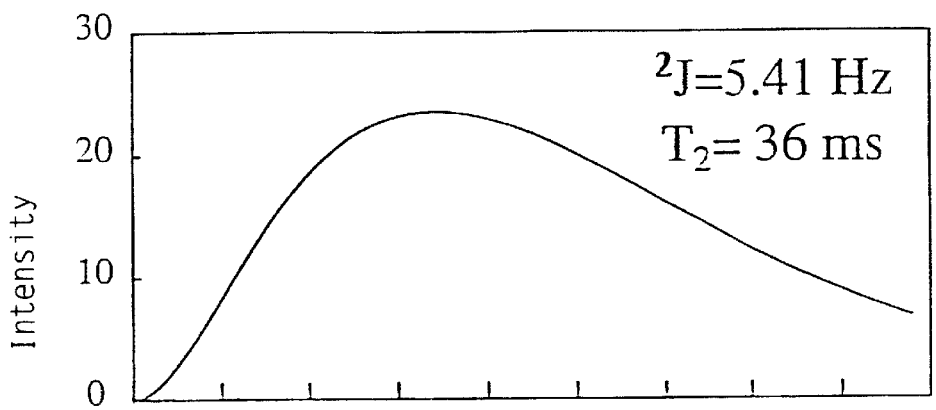
FIG. 3 Evolution of the signal intensity as a function of the delay time τ for three different groups.
Figure 3B:
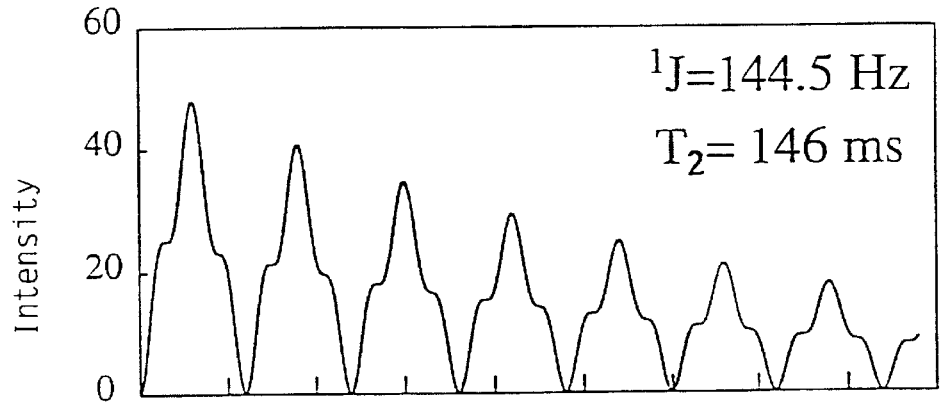
Figure 3C:
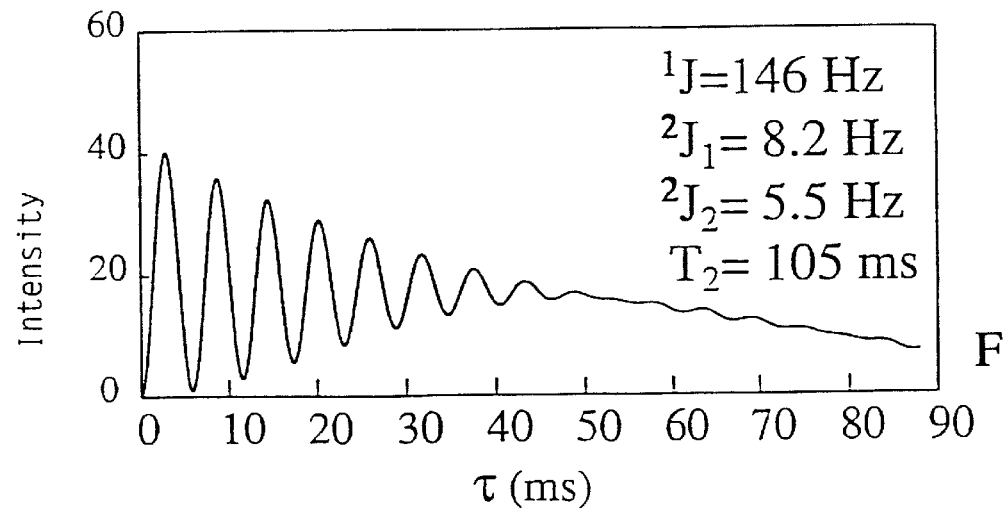

FIG. 3 shows the evolution of signal intensity as a function of the delay τ for three various groups. The quaternary carbon (FIG. 3a) should in principle be suppressed because it is not directly bonded to any proton. However we observe a significant signal whose evolution can be fitted with a small value of the $J_{CH}$ coupling, 0.9 Hz. The value of this coupling is in agreement with the order of magnitude for two-bond $J_{CH}$ couplings in literature. Thus, for long values of τ, the two-bond $J_{CH}$ couplings, despite the fact that they are quite small, are responsible for the creation of MQ heteronuclear coherence. For the $CH_3$ group (b in FIG. 3) and the CH group (c in FIG. 3) the experimental data are in good agreement with theoretical predictions. The $CH_3$ group is "isolated" from other protons, so that long-range $J_{CH}$ couplings do not influence its signal evolution. In order to fit correctly the experimental data for the $CH_2$ group, we need to account for a one-bond $^1J_{CH}$ coupling together with two different two-bond $^2J_{CH}$ couplings present in the camphor molecule. This model fits better the data than a model taking into account only one $^1J_{CH}$ coupling. The values of the fitted parameters were $^1J_{CH2}$=146 Hz, $^2J_1$=8.2 Hz, $^2J_2$=5.5 Hz and $T_2^{CH2}$=105 ms, $J_{CH3}$=144.5 Hz and $T_2^{CH3}$=146 ms. The values of the one-bond $J_{CH}$ are in good agreement with the experimental couplings that can be measured in the carbon spectrum with FSLG decoupling during acquisition (78 Hz and 74 Hz for peaks 4 and 10 respectively).

FIG. 4 compares the efficiencies of one-bond and geminal transfers in the MAS-J-HMQC experiment (a), and the dipolar CP-HETCOR experiment (b). In the MAS-J-HMQC experiment, the contribution to the signal intensity of long-range two-bond $J_{CH}$ couplings is not so important as the one of geminal dipolar couplings in the dipolar HETCOR experiment. This is illustrated in FIG. 4c and d showing the ratio of the two mechanisms for the two types of experiments. Note that in the MAS-J-HMQC experiment, the transfer is oscillatory because the $J_{CH}$ coupling is orientation-independent so that all the crystallites behave identically. In the opposite, in the dipolar HETCOR experiment, the transfer from proton to carbon occurs via dipolar couplings that are orientation-dependent and modulated by the MAS (the individual crystallites change orientation with respect to the field which implies an alteration of the heteronuclear dipolar interaction). So the signal comes from the average over all the possible orientations. For a two spin system the dipolar transfer (b) can be described by a damped oscillatory behavior. Alternative dipolar-based coherence transfer schemes have been proposed like WIM-24. However to be selective, these transfer schemes have to be synchronized with the rotor period, which become problematic at high spinning rates. None of the spectra that we recorded contain cross-peaks with quarternary carbon or with non-bonded protons, which is a good experimental indication that the experiment is indeed quite selective.

Moreover, the sensitivity of the dipolar HETCOR is dependent on the size of the heteronuclear couplings, which are usually different for the various groups of the molecule. Especially, if some groups are much more flexible than others, i.e. have small dipolar couplings, taking a short CP contact time to ensure the selectivity, will prevent an efficient polarization transfer and some correlation peaks may be absent from the 2D spectrum. On the contrary, the J couplings are much more homogeneous in the whole sample and the sensitivity of the MAS-J-HMQC experiment is independent on the motion or on the conformation of the molecule. The sensitivity of the experiment will be only dependent on the linewidth of carbon and proton coherence under FSLG decoupling.

Figures 5A, 5B:
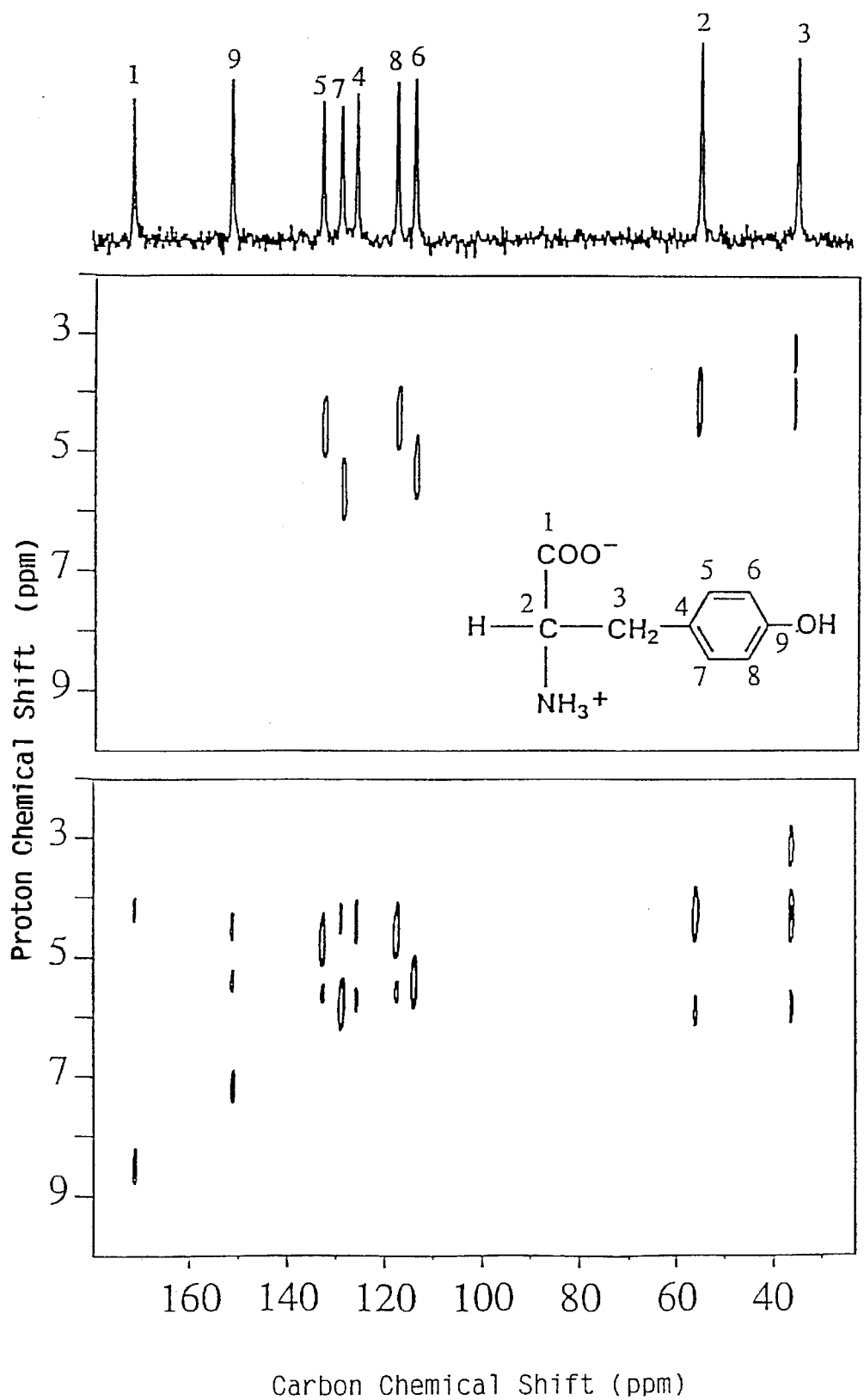
FIG. 5 two heteronuclear correlation spectra of L-tyrosine in natural abundance, (a) MAS-J-HMQC-experiment, (b) dipolar HETCOR-experiment.

The difference in selectivity between the two experiments can be appreciated in FIG. 5 which shows two heteronuclear correlation spectra on a natural abundance sample of L-tyrosine, recorded with the MAS-J-HMQC experiment (a), and with a dipolar HETCOR experiment (transfer through cross-polarization) (b). The assignment of the 1D CP-MAS spectrum indicated on the top of FIG. 5, was performed on a fully-labeled sample of L-tyrosine using the INADEQUATE experiment. The dipolar HETCOR experiment on L-tyrosine (fully labeled sample) had been already reported. In the MAS-J-HMQC spectrum, as expected, the CH groups (peaks 2, 5, 6, 7, 8) yield only one correlation with their attached proton, whereas there is no correlation for the quartenary carbons. Carbon 3 ($CH_2$ group) correlates with two different proton chemical shifts which are attributed to the two diastereotopic protons. On the dipolar HETCOR spectrum (FIG. 5b) a lot of additional peaks due to long-range transfers between non-bonded pairs of heteronuclei are clearly visible, and the resolution of the proton spectrum is lost. Even if these peaks which reflect spatial proximities between heteronuclei can be very useful for structural studies, they however greatly complicate the correlation spectrum and render the assignment of the carbon-bonded protons much more difficult. On the contrary this assignment is straightforward and unambiguous using the MAS-J-HMQC spectrum for which the proton resolution is greatly improved.

Of course, the selectivity of the dipolar HETCOR experiment could be improved by taking shorter contact time. However this would be at the expense of a significant loss of signal intensity, which poses a real problem for natural abundance samples. In our experimental conditions (contact time for the cross-polarization of 300 ps for the dipolar HETCOR, and a delay time τ of 1.3 ms for the MAS-J-HMQC experiment), we found that the sensitivity of the two experiment was about the same. For longer mixing periods (τ values greater than 2 ms), the quaternary carbons (peaks 1 and 9) appear in the MAS-J-HMQC spectrum (data not reported here). The evolution of the signal intensity of these peaks as a function of τ were found to be compatible with a two-bond $^2J_{CH}$ coupling transfer.

Figure 6:
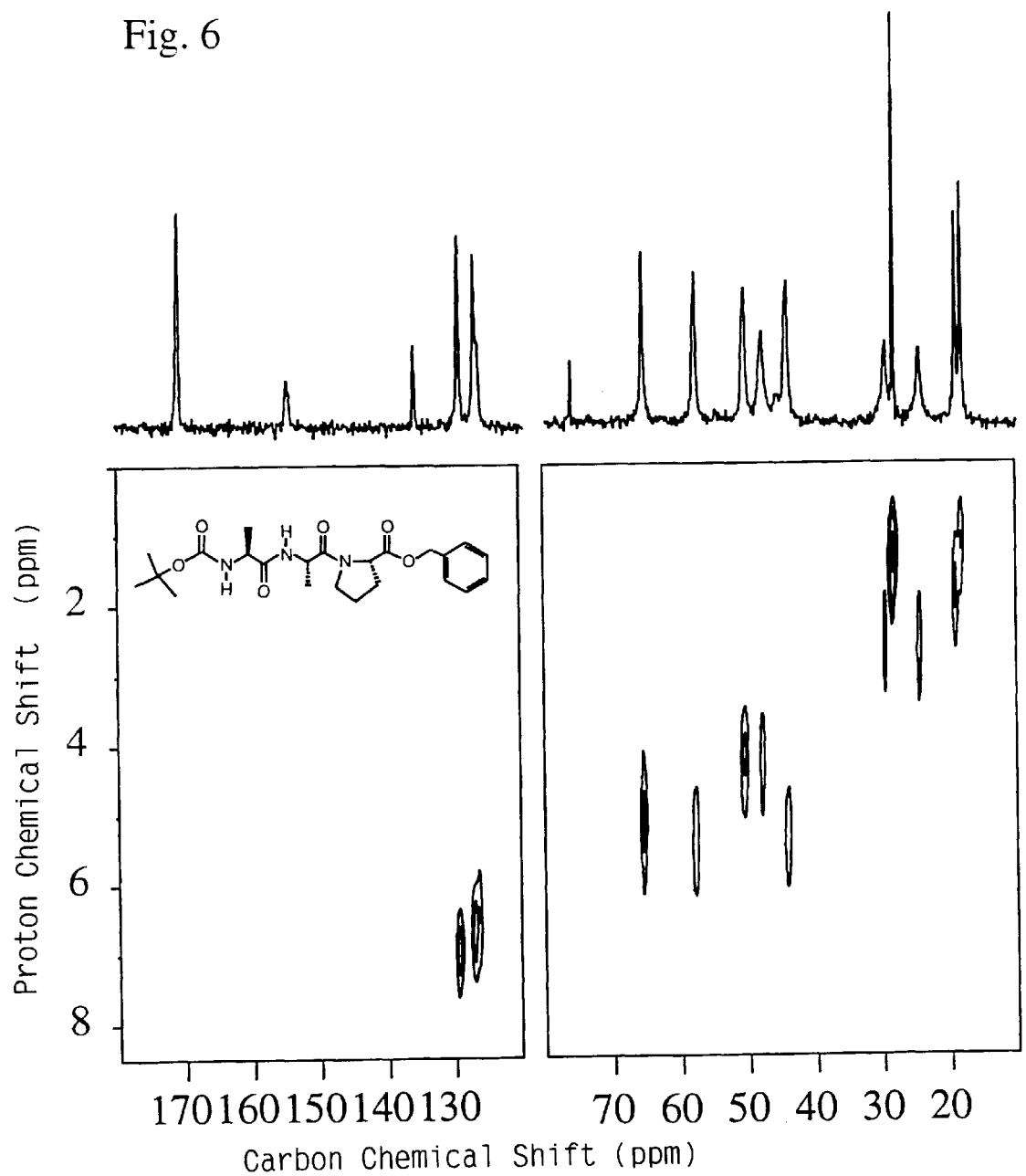
FIG. 6 MAS-J-HMQC-spectrum of the tripeptide Boc-Ala-Ala-Pro-O-Bzl.

FIG. 6 shows the MAS-J-HMQC spectrum recorded on a tripeptide Boc-Ala-Ala-Pro-O-Bzl. As pointed out previously, provided that the carbon spectrum is assigned, a MAS-J-HMQC experiment leads to the unambiguous assignment of the proton spectrum and to the measurement of proton chemical shifts. For the tripeptide, we do not know the assignment of the carbon spectrum. Indeed, if several methods have been proposed to characterize the highly resolved MAS spectra of rare nuclei in labeled compounds, the assignment of the carbon spectrum remains a difficult task for non-enriched compounds. In such cases, the correlation with the proton dimension may provide an additional source of information and be useful to assign the carbon spectrum. For example for the tripeptide, we can state without ambiguity that the four carbon resonances which are not correlated to a proton chemical shift (77 ppm, 135 ppm, 165 ppm and 171 ppm) correspond to quaternary carbons. In the same way, the three carbon resonances (18 ppm, 19 ppm and 28 ppm) which correlate with protons around 1 ppm can be assigned to the three methyl groups.

We finally applied the MAS-J-HMQC experiment to cholesteryl acetate. This large compound (30 carbons) crystallizes with two molecules per unit cell. Once again the resolution of the proton spectrum is excellent. This demonstrates that the experiment can be used to measure proton chemical shifts in solids. Note that in this case, as the dispersion of the proton spectrum is small, a dipolar HETCOR spectrum on this sample would be probably too much complicated to be useful.

In conclusion, we have shown that scalar $J_{CH}$ couplings can be used to create heteronuclear multiple-quantum coherence in ordinary organic solids. A new two-dimensional carbon-proton correlation experiment has been proposed, yielding cross-peaks between pairs of bonded heteronuclei. (Note that the technique does not work in the presence of homonuclear C—C scalar couplings, i.e., in multiple carbon-13 labeled systems). Unlike to previously proposed heteronuclear correlation experiments, which were based on dipolar couplings, the technique is highly selective and allows the unambiguous identification of proton chemical shifts. We have used this technique on model samples, as well on a tripeptide and on cholesteryl acetate, a rigid molecule having 29 carbon atoms. The technique should become widespread for proton spectral characterization in solids.

In the following, the figures are described in some more detail.

FIG. 1a Preferred pulse sequence for the MAS-J-HMQC experiment. The coherence pathways of proton and carbon, selected by the phase cycle are also indicated.

FIG. 1b The theoretical evolution of carbon signal intensity as a function of the delay time τ. The calculations were performed for 0 Hz line width and a coupling of 130 Hz. This corresponds to the "ideal" liquid case and to a typical $^1J_{C-H}$ coupling for aliphatic carbon. These couplings are typically much greater than two- or three-bond couplings which are neglected in a first order approximation. In order to achieve a maximum signal for all coupling types of $CH_n$ groups, the delay time has to be set to 2 ms. For each $CH_n$ group (n=1, 2, 3), the curves were obtained using the following expressions:

$$I_{CH_3} = \frac{1}{2} I^0_{CH_3}(c_1c_2s_3 + s_1c_2c_3 + c_1s_2c_3 + s_1s_2s_3)\exp(-2\tau/T_2^{CH_3})$$

$$I_{CH_2} = \frac{1}{2} I^0_{CH_2}(c_1s_2 + s_1c_2)\exp(-2\tau/T_2^{CH_2})$$

$$I_{CH} = \frac{1}{2} I^0_{CH} c_1 \exp(-2\tau/T_2^{CH})$$

$I_0$ is the signal intensity after cross polarization and $T_2$ the transverse relaxation (dephasing) time during the period 2τ (equal to 1/πΔ). $c_i=\cos(2\pi\tau J_i)$ and $s_i=\sin(2\pi\tau J_i)$. The expressions were calculated using the product operators algebra and a liquid-like J coupling Hamiltonian. Note that the signal intensity of a $CH_3$ contains two distinct contributions: one from a pure single quantum coherence between the carbon and one proton and one contribution from triple quantum coherence (term $S_x I_{1x} I_{2x} I_{3x}$ in the density operator) with different functional dependencies.

FIG. 1c The theoretical evolution of carbon signal intensities as a function of the delay time τ. The calculations were performed for 50 Hz line width and a coupling of 70 Hz. This corresponds to a typical line width in solids and a $^1J_{CH}$ coupling for an aliphatic carbon decoupled with FSLG decoupling and scaled with the factor 1/√3.

FIG. 2 Two-dimensional MAS-J-HMQC spectrum of camphor. A total of 256 $t_1$ increments with 8 accumulations were collected. The spinning speed was 2.5 kHz and the delay τ was set to 2 ms. The 1D CP-MAS spectrum is shown above the 2D spectrum.

FIG. 3 Evolution of the signal intensity in one-dimensional MAS-J-HMQC experiments as a function of the delay time τ for peaks number 6 (a), 4 (b) and 10 (c) of camphor. The points are the measured values whereas the solid curves correspond to fittings from analytical expressions (calculated using the product operators algebra and a liquid-like J coupling Hamiltonian). The adjustable parameters were the overall intensity, the $J_{CH}$ couplings and the transverse relaxation time. The simulations were done by considering one $J_{CH}$ coupling for peaks 7 and 4, and two different J couplings for peak 10.

FIG. 4 Coherence transfer efficiencies as a function of the mixing period τ in the MAS-J-HMQC experiment (a) and in the dipolar HETCOR experiment (b). In (a) the curves were calculated according to the equations given in the legend of FIG. 1 for a CH group. The solid line corresponds to the transfer through a one-bond $^1$J coupling (70 Hz), while the dashed line corresponds to the transfer through a two-bond $^2$J coupling (6 Hz). For the dipolar HETCOR experiment (b), a cross-polarization scheme was considered for the polarization transfer. The following expression was used for the calculations $$\langle S_x \rangle(t) = \frac{1-g(t)}{2} \text{ where: } g(t) = \frac{1}{2}\int_\theta \cos[b(\theta)t]\sin(\theta)d\theta$$

and b(θ) is the orientation dependent dipolar coupling.

The calculations were performed in the case of a directly bonded pair of carbon-proton, using a inter-nuclei distance of 0.98 Å corresponding to a dipolar coupling of 23 kHz (solid line), and in the case of two geminal nuclei, using a distance of 2.08 Å for a dipolar coupling of 3.3 kHz (dashed line). The relaxation was not considered in these calculations. In (c) and (d), the ratio of the transfer efficiencies between directly-bonded and geminal nuclei, is represented for the two types of heteronuclear correlation experiments. The MAS-J-HMQC experiment has a better selectivity than the dipolar HETCOR with respect to the transfer from closest neighbors. For τ values of 1.3 ms and 300 μs for respectively the MAS-J-HMQC experiment and the dipolar HETCOR experiment, the selectivity of transfer is 16 times greater in the MAS-J-HMQC than in the dipolar HETCOR.

FIG. 5 Two-dimensional MAS-J-HMQC spectrum (a) and dipolar HETCOR spectrum (b) of a natural abundance sample of L-tyrosine monohydrochloride. The spinning speed was 15 kHz. The delay τ was adjusted to 1.3 ms for the MAS-J-HMQC experiment, and the contact time for CP in the dipolar HETCOR was 300 μs. A total of 256 $t_1$ increments with 96 each were collected.

FIG. 6 Two-dimensional MAS-J-HMQC spectrum of a natural abundance sample of the tripeptide Boc-Ala-Ala-Proc-O-Bzl. The spinning speed was 15 kHz and the delay τ was adjusted to 1.3 ms. A total of 256 $t_1$ increments with 96 scans each were collected.

Figure 7:
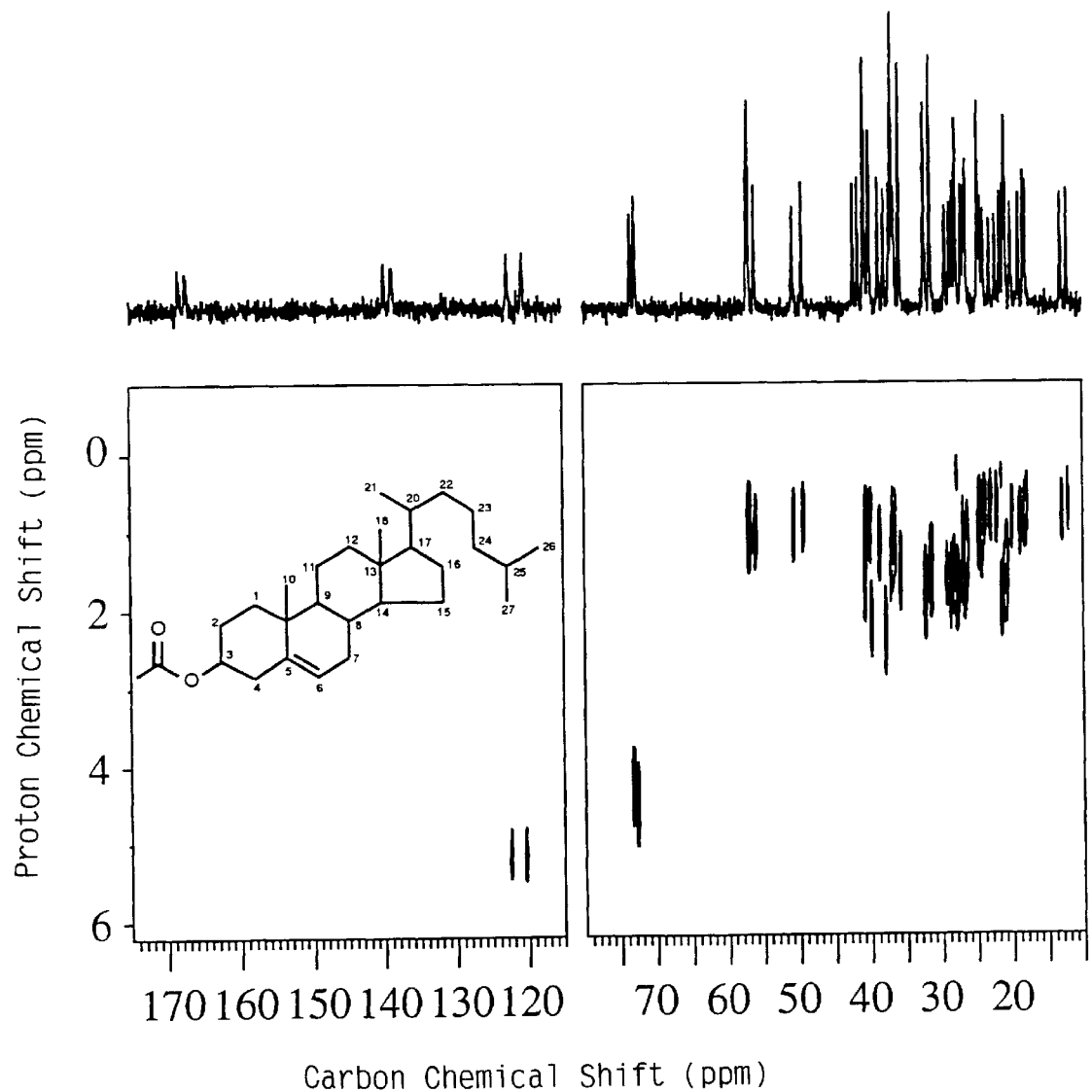
FIG. 7: Two-dimensional MAS-J-HMQC-spectrum of Cholesterylacetate in natural abundance.

FIG. 7 Two-dimensional MAS-J-HMQC spectrum of cholesteryl acetate. The spinning speed was 15 kHz and the delay τ was adjusted to 1.3 ms. A total of 256 $t_1$ increments with 96 scans each were collected.

What is claimed is:

1. A method of two-dimensional, heteronuclear correlation spectroscopy for the investigation of solid state samples, containing a first ($^1$H) and a second ($^{13}$C) nuclear species, in a nuclear magnetic resonance (NMR) spectrometer by means of an NMR pulse sequence, which pulse sequence comprises a preparation interval, an evolution interval, a mixing interval and a detection interval, wherein during the preparation interval the first nuclear species is excited by at least one preparation RF pulse in a first frequency band and is exposed to evolution RF pulses inside the first frequency band during the evolution interval and wherein during the detection interval the first nuclear species is exposed to at least one decoupling RF pulse inside the first frequency band while the free induction decay in the second frequency band is detected and wherein the pulse sequence ($1 \leq p \leq n$) is repeated n times in a row with identical preparation interval, mixing interval and detection interval but with changed evolution interval and wherein the sample rotates with a rotation frequency greater than 1 kHz about an axis which is tilted by about 54° with respect to the axis of a homogeneous magnetic field and wherein the at least one preparation RF pulse is broad-banded with a center frequency in the center of the NMR spectrum of the first nuclear species of the sample effecting a rotation of the nuclear magnetization of the first nuclear species about an axis perpendicular to the direction of the magnetic field (X) with an angle of preferably 90° and wherein the evolution RF pulses form a so-called FSLG sequence with two successive broadband evolution RF pulses, phase shifted with respect to each other by 180° (Y, −Y), whose center frequencies are shifted in opposite directions with respect to the preparation RF pulse and which each effect a rotation of the nuclear magnetization of the first nuclear species by about 294°, wherein during the preparation interval the first nuclear species is irradiated with CP radio frequency pulses in the first frequency band in order to transfer the nuclear magnetization to the second nuclear species, and the second nuclear species is irradiated in a second frequency band with at least one excitation radio frequency pulse, the mixing interval is split into two partial intervals, the first of which is located between preparation and evolution interval, and the second one between evolution interval and detection interval, and in both mixing partial intervals the mixing radio frequency pulses form a socalled FSLG sequence with two successive broadband evolution radio frequency pulses, phase shifted (X, −X) with respect to one another by 180° with center frequencies that are shifted with respect to that of the preparation radio frequency pulse in opposite directions and which each effect a rotation of the nuclear magnetization of the first nuclear species by about 294°, and wherein in the center of the evolution interval the second nuclear species experiences a broadband 180° refocusing pulse with a center frequency in the center of the nuclear resonance spectrum of the second nuclear species, whereby a correlation spectrum of both nuclear species is created that correlates the chemical shifts of both nuclear species for directly bonded pairs via scalar coupling.

2. Method according to claim 1, where the first nuclear species is $^1$H and the second nuclear species is $^{13}$C.

3. Method according to claim 1, wherein during n-fold execution of the pulse sequence, in the pth evolution interval ($1 \leq p \leq n$) both evolution RF pulses are sequentially irradiated (p-1) times.

4. Method according to claim 2, wherein during n-fold execution of the pulse sequence, in the pth evolution interval (1<p<n) both evolution RF pulses are sequentially irradiated (p-1) times.

5. Method according to claim 1, wherein between the first mixing partial interval and the evolution interval, three RF pulses are irradiated in the frequency band of the first nuclear species, the first one rotating the nuclear magnetization of the first nuclear species by about 54° ($\Theta_m$) about an axis perpendicular to the magnetic field (−Y), followed by a respectively phase shifted ($\phi_2$) 90° pulse, followed by an RF pulse, rotating the nuclear magnetization of the first nuclear species by about 54° ($\Theta_m$) about an axis perpendicular to the magnetic field (+X), and between the evolution interval and the second mixing partial interval three RF pulses are irradiated in the frequency band of the first nuclear species, the first one rotating the nuclear magnetization of the first nuclear species by about 54° ($\Theta_m$) about an axis perpendicular to the magnetic field (−X), followed by a respectively phase shifted ($\phi_3$) 90° pulse, followed by an RF pulse, rotating the nuclear magnetization of the first nuclear species by about 54° ($\Theta_m$) about an axis perpendicular to the magnetic field (+Y).

6. Method according to claim 1, wherein during the detection interval the nuclear spins of the first nuclear species are decoupled by a TPPM sequence.

7. Method according to claim 1, wherein between the $p^{th}$ detection interval and the $(p+1)^{th}$ preparation interval a delay interval is introduced that is longer than the relaxation times $T_1$ of both nuclear species.

8. Method according to claim 1, wherein the phases of excitation RF pulses in the intervals are varied according to a CYCLOPS sequence.

9. Method according to claim 1, wherein the rotation frequency of the sample is greater than 10 kHz.

10. Method according to claim 5, wherein the rotation frequency of the sample is greater than 10 kHz.

11. Method according to claim 1, wherein the duration of both evolution RF pulses is each shorter than 15 μs.

12. Method according to claim 10, wherein the duration of both evolution RF pulses is each shorter than 15 μs.

13. Method according to claim 1, wherein the frequency shift of the center frequencies of both evolution RF pulses with respect to the preparation pulse are symmetric and between ±40 kHz and ±100 kHz.

14. Method according to claim 1, wherein the frequency shift of the center frequencies of both evolution RF pulses with respect to the preparation pulse are symmetric and between ±40 kHz and ±100 kHz.

15. Method according to claim 12, wherein the frequency shift of the center frequencies of both evolution RF pulses with respect to the preparation pulse are symmetric and between ±40 kHz and ±100 kHz.

16. Method according to claim 1, wherein the frequency shift of the center frequencies of both evolution RF pulses is phase-continuous.

17. Method according to claim 15, wherein the frequency shift of the center frequencies of both evolution RF pulses is phase-continuous.

18. Method according to claim 1, being part of a three-dimensional spectroscopy method.

19. Method according to claim 1, being used to determine scalar couplings.

20. Method according to claim 1, being applied for editing of nuclear resonance spectra (spectral editing).

* * * * *